(12) United States Patent
Honda

(10) Patent No.: US 6,406,942 B2
(45) Date of Patent: Jun. 18, 2002

(54) FLIP CHIP TYPE SEMICONDUCTOR DEVICE AND METHOD FOR MANUFACTURING THE SAME

(75) Inventor: Hirokazu Honda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/801,901

(22) Filed: Mar. 9, 2001

(30) Foreign Application Priority Data

Mar. 9, 2000 (JP) ........................... 2000-065792

(51) Int. Cl.$^7$ ............................................. H01L 21/44
(52) U.S. Cl. ................. 438/119; 438/118; 438/106; 438/455; 438/459
(58) Field of Search ....................... 438/455, 459, 438/106, 107, 108, 118, 119, 121, 458

(56) References Cited

U.S. PATENT DOCUMENTS 6,183,588 B1 * 2/2001 Kelly et al. ................. 156/247

FOREIGN PATENT DOCUMENTS

JP         9283925 A   * 10/1997
JP      2001168242 A   * 6/2001

* cited by examiner

Primary Examiner—John F. Niebling
Assistant Examiner—Christopher Lattin
(74) Attorney, Agent, or Firm—Young & Thompson

(57) ABSTRACT

A multilayer wiring structure is formed on a flat metal plate and then an entire surface of the metal plate is etched away to thereby leave only a multilayer wiring layer. An insulating substrate having through hole sections is bonded to the multilayer wiring layer, a conductive bonding agent is embedded into the through hole section, a semiconductor chip is mounted and a solder ball is coupled.

8 Claims, 15 Drawing Sheets

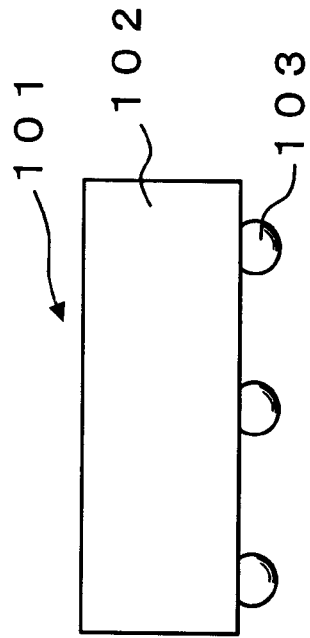
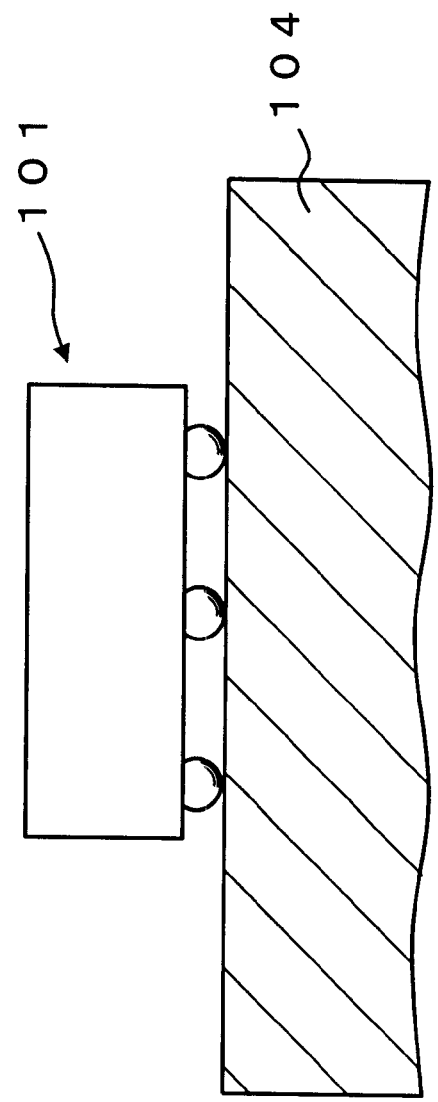
FIG. 1A (PRIOR ART)
FIG. 1B (PRIOR ART)

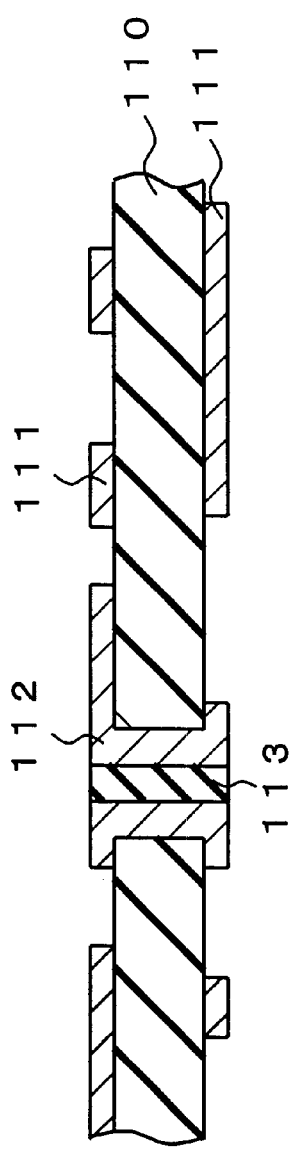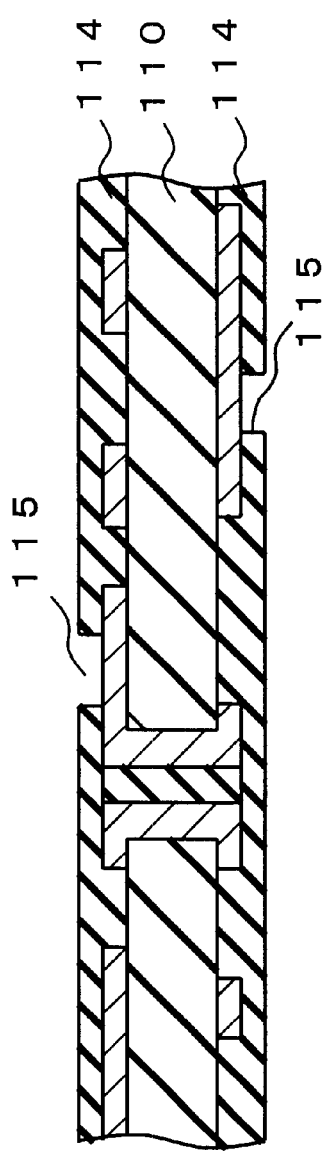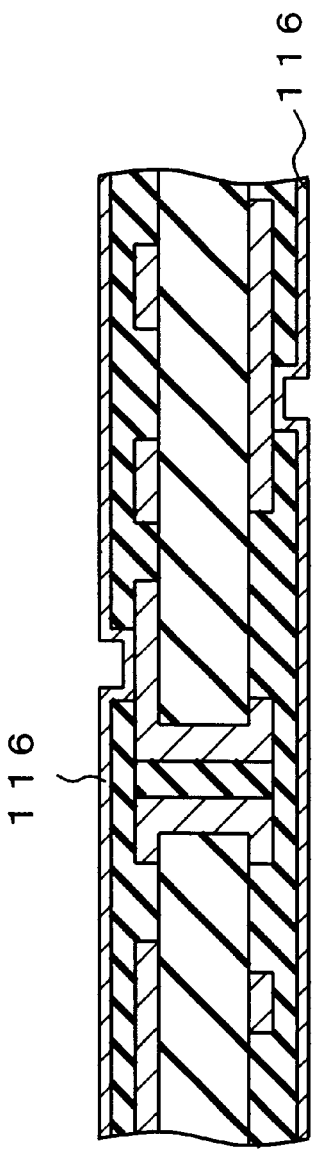
FIG. 2A (PRIOR ART)
FIG. 2B (PRIOR ART)
FIG. 2C (PRIOR ART)

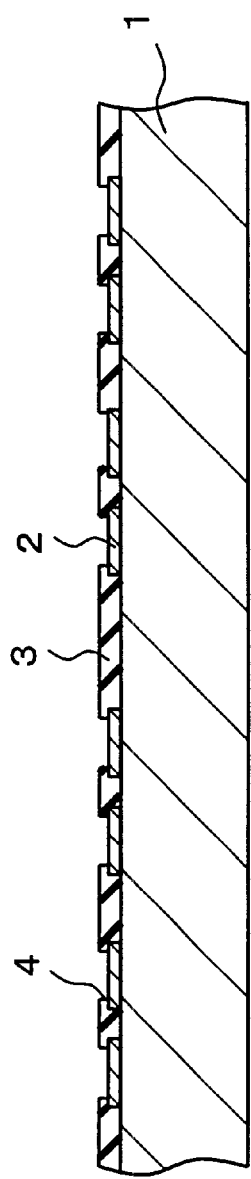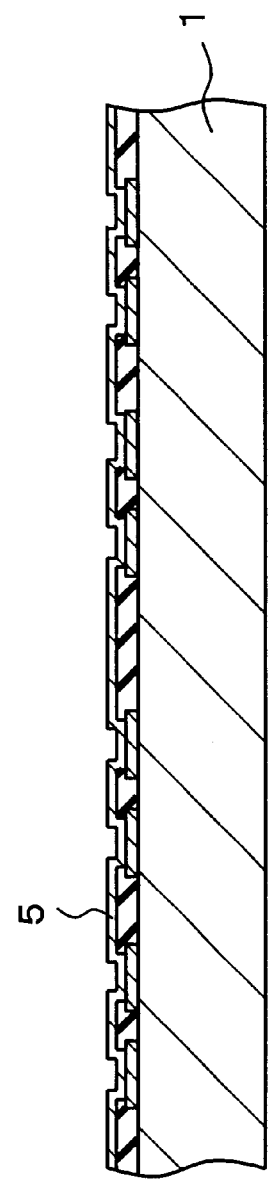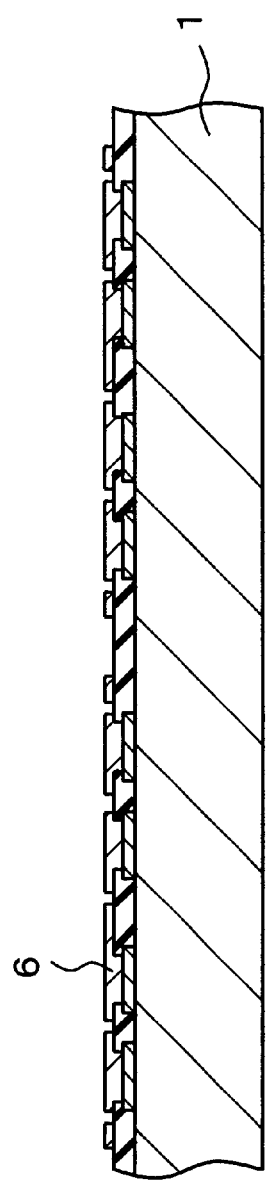
FIG. 3D
FIG. 3E
FIG. 3F

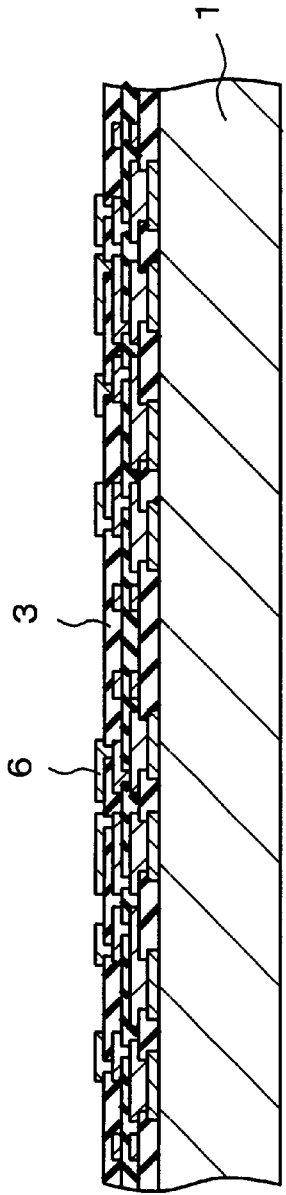
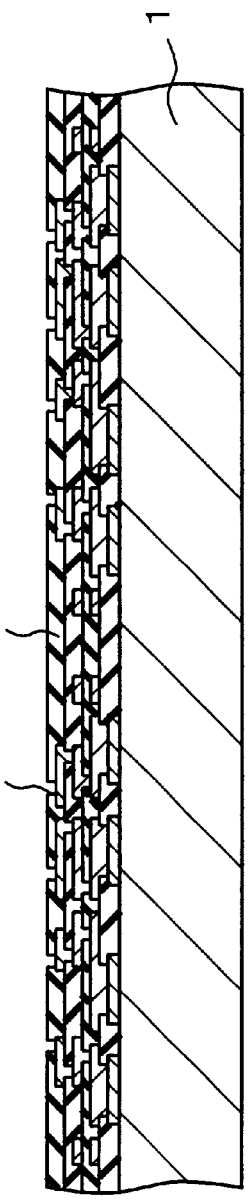
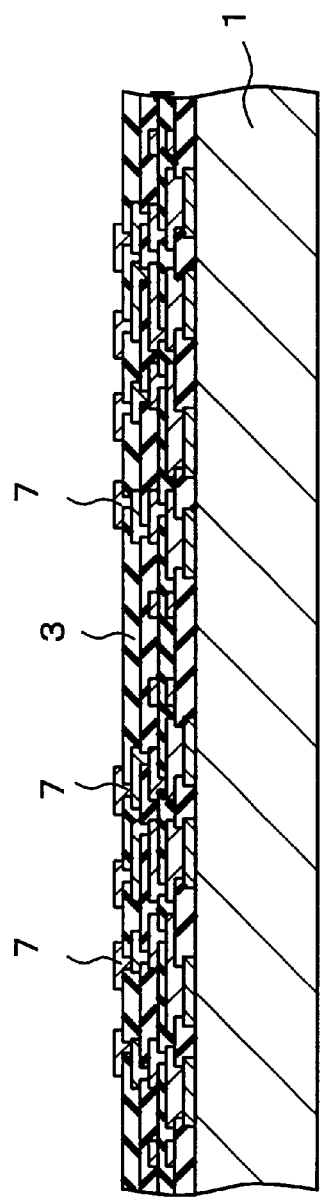
FIG. 3J
FIG. 3K
FIG. 3L

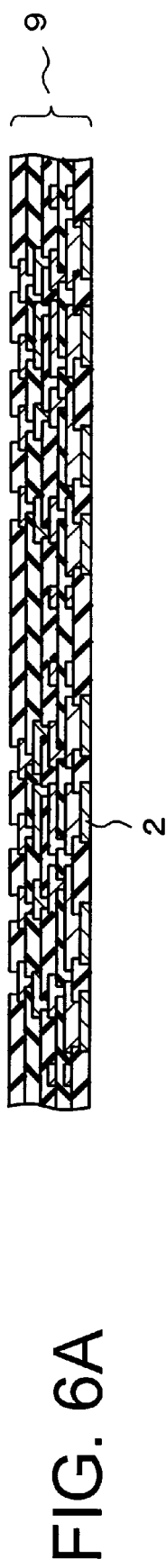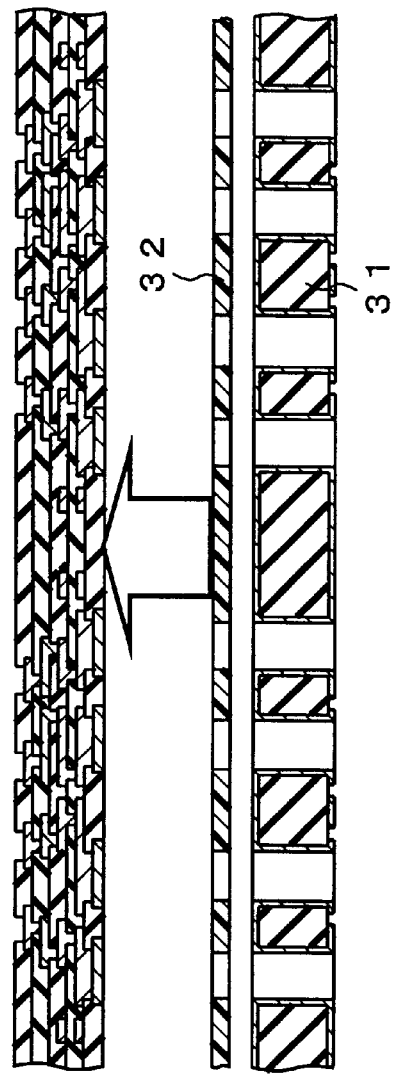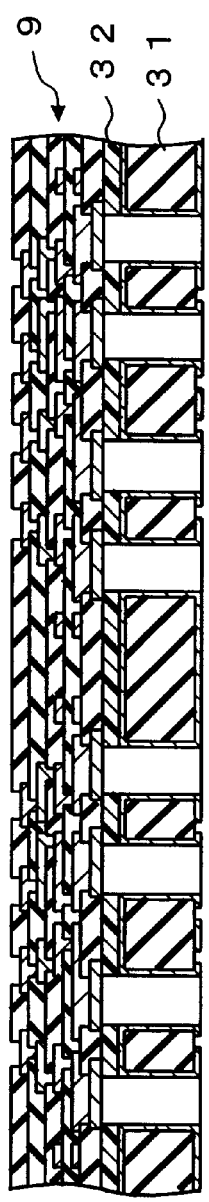
FIG. 6A
FIG. 6B
FIG. 6C

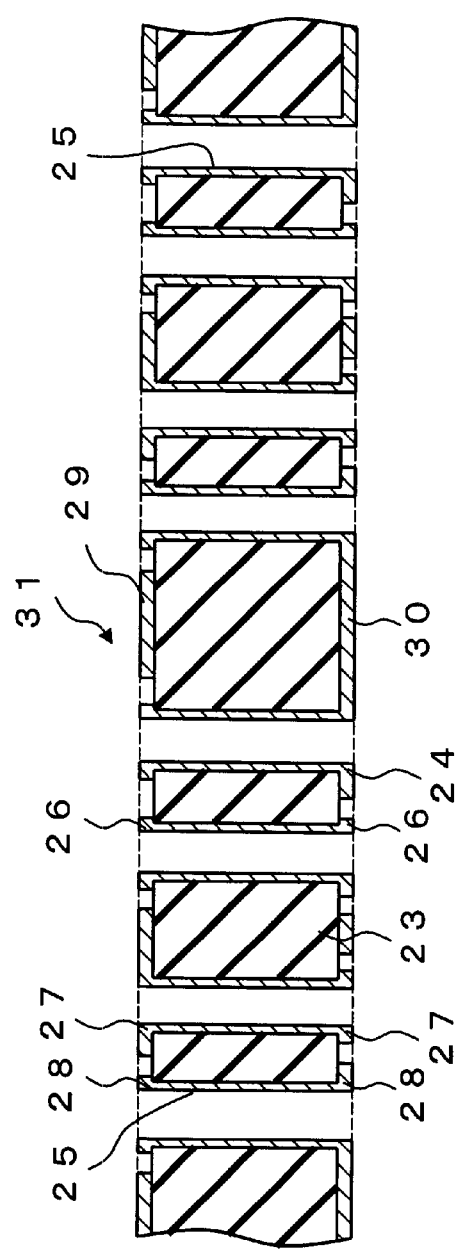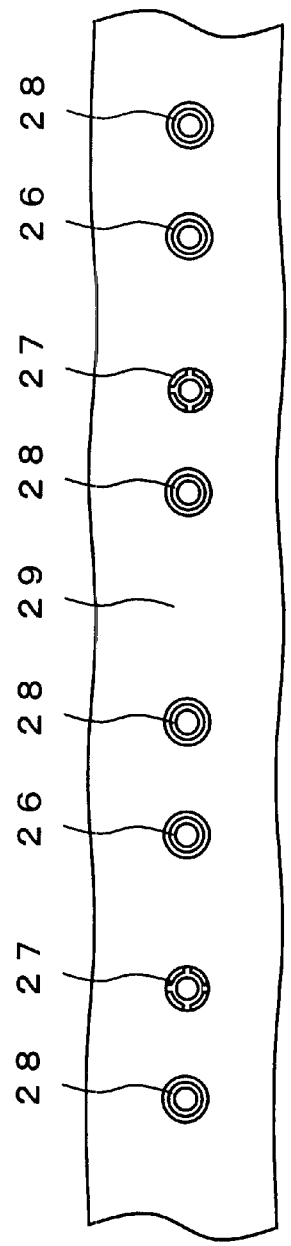
FIG. 7A
FIG. 7B

FLIP CHIP TYPE SEMICONDUCTOR DEVICE AND METHOD FOR MANUFACTURING THE SAME

BACKGROUND OF THE INVENTION

1. Field of the Invention

The present invention relates to a flip chip type semiconductor device wherein semiconductor chips are mounted on a multilayer wiring substrate and a method for manufacturing the same. Particularly, the present invention relates to a flip chip type semiconductor device which can be manufactured at low cost and set the wiring pattern pitch of the multilayer wiring substrate at 10 μm or less and a manufacturing method thereof.

2. Description of the Related Art

FIGS. 1A and 1B show a conventional flip chip type semiconductor device 101. In the flip chip type semiconductor device shown in FIG. 1A, external terminals (not shown) are formed in the peripheral sections of a semiconductor chip 102 or an active region on the semiconductor chip 102 in an area array arrangement. Protruding bumps 103 are formed out of a metal material such as a solder, Au, an Sn—Ag alloy or the like on the external terminals, respectively.

This flip chip type semiconductor device 101 is mounted on a multilayer wiring mounted substrate 104 as shown in FIG. 1B. Electrode pads are formed on the multilayer wiring mounted substrate 104 to have the same pattern as the bump array pattern of the flip chip type semiconductor device 101. An end user mounts the flip chip type semiconductor device 101 on the multilayer wiring mounted substrate 104 while the bumps 103 of the device 101 aligned to the electrode pads of the multilayer wiring mounted substrate 104, respectively. If a solder is used as a bump material, the flip chip type semiconductor device 101 is mounted on the multilayer wiring mounted substrate 104 by an IR reflow step using flux.

However, the conventional flip chip type semiconductor device 101 has a disadvantage in that after mounting the semiconductor device 101 on the multilayer wiring mounted substrate 104, a temperature cycle characteristic, in particular, among mounting reliability factors deteriorates due to mismatch in the linear expansion coefficient between the multilayer wiring mounted substrate 104 and the flip chip type semiconductor device 101. To solve this disadvantage, the following measures have been conventionally taken.

First, with a view to making the linear expansion coefficient of the multilayer wiring mounted substrate 104 closer to that of silicon, a ceramic material such as AlN, mullite or glass ceramic, which is expensive as a material, has been used to minimize mismatch in the linear expansion coefficient, to thereby enhance mounting reliability. Although this attempt was effective for enhancing mounting reliability, it is applicable only to high-end super computers, large computers or the like because an expensive ceramic material is used for the multilayer wiring substrate.

In recent years, there is proposed a technique capable of enhancing mounting reliability by mounting a flip chip semiconductor device while arranging an under-fill resin between a multilayer wiring substrate made of an organic material, which is inexpensive and has a high linear expansion coefficient, and a semiconductor chip. By arranging the under-fill resin between the semiconductor chip and the multilayer wiring substrate made of an organic material, it is possible to disperse a shearing force exerted on a bump connection portion existing between the semiconductor chip and the multilayer wiring substrate made of an organic material and to thereby enhance mounting reliability. In this way, it is possible to employ a multilayer wiring substrate made of an inexpensive organic material by interposing an under-fill resin between the semiconductor chip and the multilayer wiring substrate made of the organic material.

Nevertheless, with this conventional technique, if voids exist in the under-fill resin, or the bonding characteristic at the interface between the under-fill resin and the semiconductor chip and the interface between the under-fill resin and the multilayer wiring substrate made of an organic material are not good, a separation of the bonding portion occurs at the interfaces in a step of reflow absorbing the moisture to a product to thereby disadvantageously make the product defective. For that reason, the above-stated conventional technique does not ensure reducing the cost of a flip chip type semiconductor device.

Further, a multilayer wiring substrate referred to as a buildup substrate is normally employed for a multilayer wiring substrate made of an organic material for a flip chip type semiconductor device because of the shortest pitch of a bump array pattern and the number of pins. A method of manufacturing this buildup substrate will be described with reference to FIGS. 2A to 2F.

First, as shown in FIG. 2A, a Cu foil layer 111 having a predetermined thickness of 10 to 40 μm is bonded to each surface of a core substrate 110 made of an insulating glass epoxy material and patterning is conducted to the Cu foil layer 111. After forming holes in the core substrate 110 by drilling or the like, the through holes are subjected to a plating processing, thereby forming penetrating through hole sections 112 to electrically connect the Cu foil layers 111 on the both surfaces of the core substrate 110 to each other. In that case, an insulating resin layer 113 is usually filled in the penetrating through hole section 112 in light of the process stability of later steps and the quality stability of the substrate.

Next, as shown in FIG. 2B, an insulating resin layer 114 is arranged on the Cu wiring pattern existing on the front and rear surfaces of the core substrate 110, respectively and openings 115 are thereby formed at predetermined positions of the insulating resin layer 114 by a chemical etching method utilizing a photoresist technique, a laser processing technique or the like.

Then, as shown in FIG. 2C, metal thin layers 16 are formed by sputtering metal such as Ti or Cu, or by electroless plating Cu on the insulating resin layer 114 so as to secure the electrical connection between a feed layer for electrolytic plating of Cu and the Cu wiring pattern on the core substrate.

Thereafter, as shown in FIG. 2D, to form a wiring pattern by electrolytic plating of Cu, a photo-resist 117 or a dry film having a thickness of about 20 to 40 μm is arranged on each surface of the metal thin film layer 116, and exposure and development processing is conducted thereto.

As shown in FIG. 2E, using the exposed metal thin film layers 116 as feed layers, an electrolytic plating of Cu is conducted to thereby form wiring pattern sections 118.

Then, as shown in FIG. 2F, after separating the photoresists 117 or dry films, using the wiring pattern sections 118 as a mask, the metal thin film layers 116 are removed by wet etching and the wiring pattern sections 118 are made electrically independent.

By repeating the steps shown in FIGS. 2B to 2F, it is possible to form a multilayer wiring substrate having six or eight metal layers according to necessity.

However, in the above-stated buildup substrate manufacturing method, it is necessary to employ photoresists 117 or dry films each having a thickness of about 20 to 40 μm so as to secure the thickness of the buildup layer wiring pattern sections in view of the relax of a stress caused by the difference in the thermal expansion coefficient between the core substrate 110 and the buildup substrate and the reliability of the multilayer wiring substrate such as the reliability of connection via hole sections and the like. Due to this, it is necessary to use photoresists 117 or dry films each having a thickness of 20 to 40 μm. Pattern formation characteristic which can be realized, is only about 30 μm at the shortest pitch in exposure and development steps accordingly. As a result, the wiring pattern pitch becomes 30 μm at the shortest and it is impossible to promote making the multilayer wiring substrate high in density and the outer shape of the substrate small in size. Further, an ordinary buildup substrate manufacturing method adopts manufacturing steps of creating products altogether on a large panel of about 500 mm×600 mm and cutting the panel in a final step to thereby take out a plurality of multilayer wiring substrates. Due to this, if it is possible to make the outer dimension of a single multilayer wiring substrate small, the number of multilayer wiring substrates per panel can be increased. According to the conventional buildup substrate manufacturing method, however, the wiring pattern pitch described above can be shortened to a minimum of about 30 μm. It is, therefore, impossible to shorten the outer dimension of a single multilayer wiring substrate and difficult to greatly reduce multilayer wiring substrate cost.

The above-stated multilayer wiring substrate manufacturing method is also encountered by a warpage problem. Namely, the core substrate 110 warps. In exposure and development steps for forming buildup wiring patterns, the misalignment of resist patterns occurs due to the warp of the core substrate 110. This misalignment causes the deterioration of manufacturing yield.

Moreover, it is necessary to form buildup layers on the front and rear surfaces of the core substrate 110, respectively, which are not essentially required, so as to suppress the core substrate 110 from warping. As a result, an organic multilayer wiring substrate is forced to include more layers than necessary, which deteriorates manufacturing yield and thereby hampers the reduction of manufacturing cost.

As means for solving the above-stated disadvantages, the inventors of the present application proposed a technique disclosed in Japanese Patent Application No. 11-284566 (filed in the Japanese Patent Office on 1999). According to this prior application, there is provided a constitution in which a buildup wiring layer serving as the second substrate layer is formed on the first substrate (Base substrate) having flatness and high rigidity. It is noted that this prior application is not published for public inspection at the time of filing the present application and it does not, therefore, become a prior art.

Then, the first substrate (Base substrate) having flatness and high rigidity is selectively etched away to thereby form external electrode column sections. After forming an insulating stress buffer resin layer around each external electrode column section, a solder ball is formed as an external terminal.

By this constitution, wiring layers or, in particular, multilayer wirings which are dynamically restricted by either a material or a base layer capable of maintaining high flatness are formed. As a result, the occurrence of an internal stress to the multilayer wiring layer is suppressed, thereby making it possible to enhance yield in semiconductor device manufacturing steps.

Furthermore, the solder ball sections used to be mounted on a substrate by an end user's side are formed on the external electrode column sections surrounded by the insulating stress buffer resin layer. Due to this, it is possible to increase the standoff height of each solder ball. Besides, since the stress buffer effect of the insulating stress buffer resin layer is added, a flip chip type semiconductor device excellent in mounting reliability can be obtained.

Moreover, it is not always necessary to form a metal thin film wiring thick of about 10 to 30 μm unlike a buildup substrate according to the conventional technique and a semiconductor wafer metalization manufacturing method and a manufacturing apparatus therefor can be utilized. Thus, it is possible to easily process the thickness of each photoresist and that of a metal thin film wiring section in a region as thin as 1 μm or less and to easily form a smaller-sized wiring pattern. Additionally, by making the wiring pattern smaller in size, it is possible to increase the density of the organic multilayer wiring substrate, to decrease the outside dimensions of a single multilayer wiring substrate and to thereby considerably reduce cost.

Further, each package can be manufactured by a wafer level processing, so that the number of steps can be advantageously, greatly reduced compared with a packaging method for manufacturing packages from a single piece and cost can be advantageously, considerably reduced.

Nevertheless, with the structure proposed by Japanese Patent Application No. 11-284566, in a step of selectively etching away the first substrate (Base substrate) layer having flatness and high rigidity to thereby form external electrode column sections, if the thickness of the first substrate (Base substrate) is quite large at least 1.0 mm, the etching-away step for forming the external electrode column sections is disadvantageously made quite difficult to execute accordingly.

To execute the etching-away step, there are two methods, i.e., a wet etching method and a dry etching method. In case of the wet etching method using chemicals, the first substrate is etched isotropically, i.e., etching is conducted simultaneously in a thickness direction and a lateral direction. Due to this, if the thickness of the first substrate (Base substrate) is quite large at least 1.0 mm, in particular, it is difficult to ensure the stability of the shapes of the external electrode column sections, to minimize the irregularity of the shapes thereof, and to ensure product quality.

On the other hand, according to the dry etching method utilizing a plasma technique, the first substrate is etched anisotropically, i.e., etching is conducted in a thickness direction. This facilitates ensuring the stability of the shapes of the external electrode column sections and suppressing the irregularity of the shapes thereof. However, the normal etching rate of the dry etching method is as slow as 10 nm/minute to 100 Å/minute. If the thickness of the first substrate (Base substrate) is as large as at least 1.0 mm, it takes longer to complete etching, which makes manufacturing time longer to thereby cause cost increase.

SUMMARY OF THE INVENTION

It is an object of the present invention to provide a flip chip type semiconductor device and a method for manufacturing the same capable of manufacturing a multilayer wiring substrate having a fine wiring pattern pitch of less than 10 μm or low at low cost, preventing the occurrence of misalignment in a photolithographic step due to warpage of the substrate and avoiding disadvantages of longer etching time and longer manufacturing time.

A flip chip type semiconductor device according to the present invention comprises a multilayer wiring layer having a multilayer wiring structure; a substrate consisting of one of an insulating substrate and a multilayer wiring substrate having penetrating holes embedded with a conductive material; a bonding agent film interposed between the multilayer wiring layer and said substrate, and bonding the multilayer wiring layer to said substrate; and a semiconductor chip mounted on said multilayer wiring layer.

In this flip chip type semiconductor device, for example, the conductive material is a conductive bonding agent. And terminal balls may be coupled to the conductive bonding agent on a surface of the substrate. Also, for example, the flip chip type semiconductor device has an external electrode pad formed on an uppermost layer of the multilayer wiring layer; and a bump electrode provided on the semiconductor chip and connected to the external electrode pad.

Further, the flip chip type semiconductor device according the present invention may comprise an insulating resin layer for embedding side of the semiconductor chip; and a radiating heat spreader coupled to the semiconductor chip. Alternatively, the flip chip type semiconductor device according to the present invention may comprise a radiating heat spreader coupled to the semiconductor chip; and a stiffener arranged on each side of the semiconductor chip and interposed between the heat spreader and the multilayer wiring layer.

Meanwhile, a flip chip type semiconductor device manufacturing method according to the present invention comprises the steps of: forming a multilayer wiring structure on a first substrate consisting of a flat metal plate; etching away the first substrate to form a second substrate consisting of a multilayer wiring layer; coupling a third substrate to the second substrate consisting of the multilayer wiring layer to obtain a multilayer wiring substrate; and mounting a semiconductor chip on the second substrate.

In this flip chip type semiconductor device manufacturing method, the third substrate can be one of an insulating substrate and a multilayer substrate provided with holes.

Further, the second substrate can be manufactured by the steps of: forming an external electrode pad on the first substrate; forming an insulating thin film layer on an entire surface of the external electrode pad, and etching away the insulating thin film on the external electrode pad to form an opening; forming a metal thin layer on an entire surface, and patterning a resultant substrate to form a metal thin film wiring section connected to the external electrode pad in the opening; repeating formation of the insulating thin film layer and formation of the metal thin film wiring section; and forming an insulating resin thin film layer on an entire surface, forming an opening on the metal thin film wiring section below the insulating resin thin film layer and forming a pad electrode in the opening.

Moreover, it is possible to provide the step of embedding a conductive bonding agent into the hole of the third substrate and the step of coupling a solder ball onto the conductive bonding agent.

The semiconductor chip has a bump electrode; and in a step of mounting the semiconductor chip, the bump electrode is coupled to the external electrode pad of the second substrate.

Moreover, it is possible to provide the step of coupling a radiator to a reverse surface of the semiconductor chip through a heat transfer bonding agent. In this case, there are provided the steps of: coupling a stiffener on the second substrate at a position putting the semiconductor chip between the stiffener and the second substrate; and mounting the radiator on the semiconductor chip and the stiffener. Thus, it is possible to constitute a flip chip type semiconductor device to obtain the flatness of the multilayer wiring substrate.

According to the present invention, it is possible to maintain high flatness in the multilayer wiring substrate manufacturing steps, and to suppress the occurrence of an internal stress to the multilayer wiring layer. Further, after bonding the insulating substrate to this multilayer wiring layer, the semiconductor chip is mounted. Thus, semiconductor devices can be manufactured with high yield. Further, it is possible to employ an insulating substrate made of a material having a similar linear expansion coefficient as that of a mounting substrate employed by an end user side, on the lower layer of the multilayer wiring layer. In addition, since the solder ball is formed on the conductive bonding agent filled into the through hole in the insulating substrate, it is possible to facilitate enhancing a standoff height during mounting easily. Besides, since it is possible to minimize mismatch in the linear expansion coefficient, a flip chip type semiconductor device excellent in mounting reliability can be easily manufactured.

Furthermore, according to the present invention, it is not necessary to form the metal thin film wiring section thick or about 10 to 30 $\mu$m unlike the conventional case, and a semiconductor wafer metalization manufacturing method and a manufacturing apparatus therefor can be utilized. Due to this, the thickness of a photoresist and that of the metal thin film wiring section can be processed in a thin range of 1 $\mu$m or less, so that a finer wiring pattern can be easily obtained. Besides, by promoting a finer wiring pattern, it is possible to increase the density of an organic multilayer wiring substrate, to reduce the outer dimension of the single multilayer wiring substrate and to thereby greatly reduce manufacturing cost.

Moreover, according to the present invention, the Base substrate having high flatness is entirely removed. Thus, it is not necessary to selectively etch away this substrate, thereby making the manufacturing process quite simple.

Additionally, according to the present invention, it is possible to manufacture each package by a wafer level processing. Thus, compared with a packaging method of manufacturing respective packages from individual pieces, it is possible to greatly reduce the number of steps and to thereby greatly reduce cost.

BRIEF DESCRIPTION OF THE DRAWINGS

FIGS. 1A and 1B are cross-sectional views of a conventional flip chip type semiconductor device;

FIGS. 2A to 2F are cross-sectional views showing a method of manufacturing a conventional buildup substrate in the order of manufacturing steps;

FIGS. 6A to 6H are cross-sectional views showing a method of manufacturing a flip chip type semiconductor device in the fourth embodiment according to the present invention in the order of manufacturing steps; and FIG. 7A is a cross-sectional, enlarged view of a two-sided wiring substrate in the fourth embodiment, and FIG. 7B is a plan view thereof.

DESCRIPTION OF THE PREFERRED EMBODIMENTS

Figure 2D:
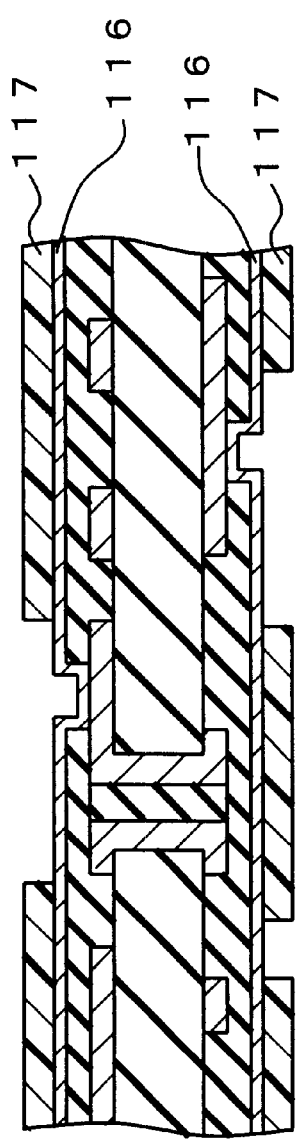
Figure 2E:
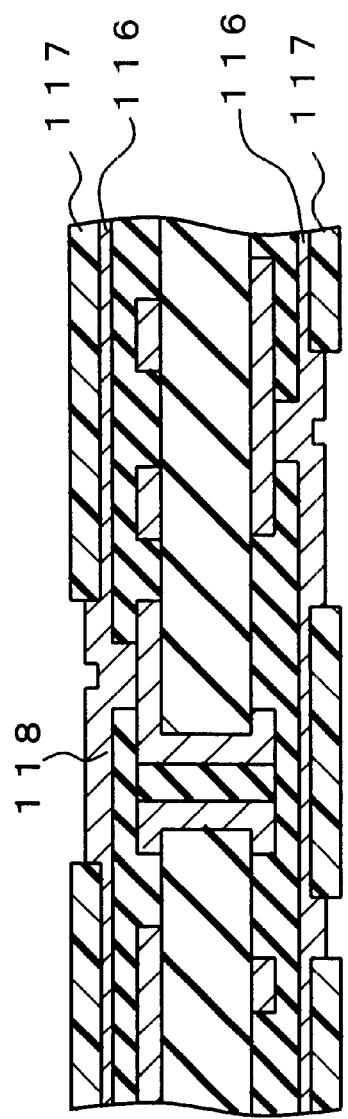
Figure 2F:
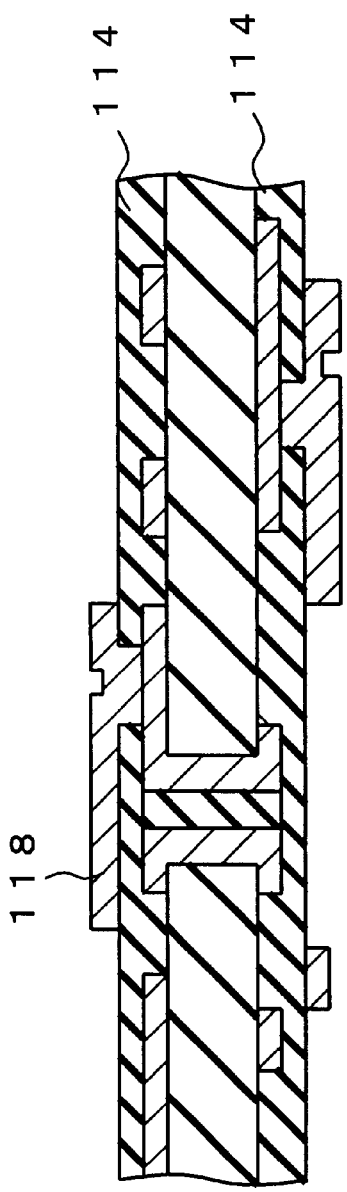
Figure 3A:
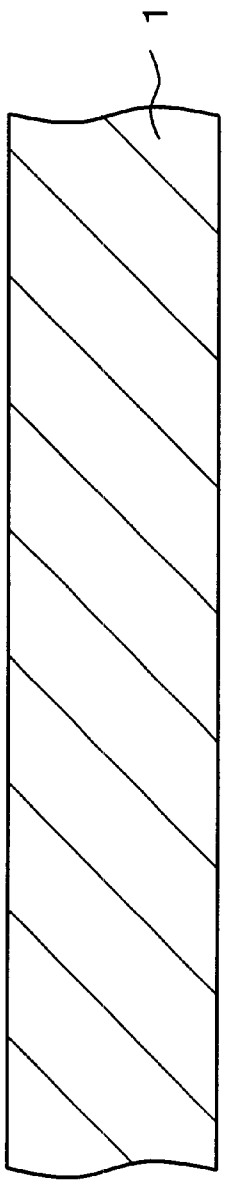
FIGS. 3A to 3U are cross-sectional views showing a method of manufacturing a flip chip type semiconductor device in the first embodiment according to the present invention in the order of manufacturing steps.

The embodiments of the present invention will be concretely described hereinafter with reference to the accompanying drawings. FIGS. 3A to 3U are cross-sectional views showing a method of manufacturing a flip chip type semiconductor device in the first embodiment according to the present invention. First, as shown in FIG. 3A, a metal plate 1 having high flatness is prepared. The metal plate 1 is made of metal or an alloy mainly consisting of Cu, Ni, Al or the like. The metal plate 1 having high flatness may have a wafer shape used in a semiconductor manufacturing step.

Figure 3B:
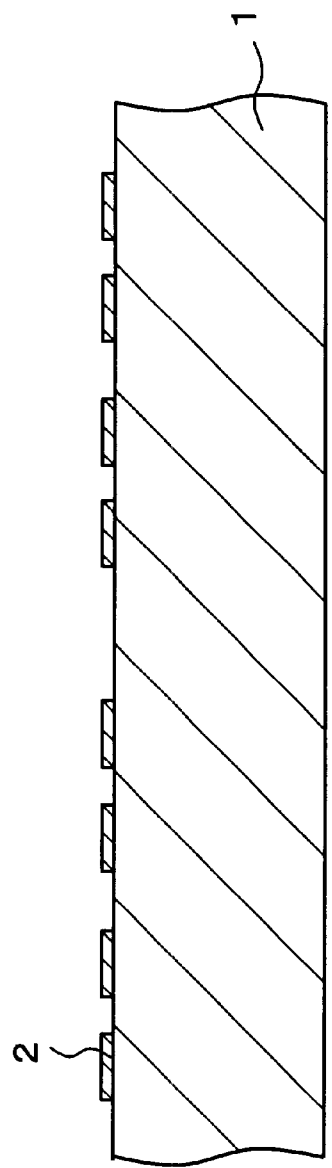

Next, as shown in FIG. 3B, Ti, Cr, Mo, a W alloy or the like is sputtered onto the metal plate 1 so as to serve as a bonding metal layer relative to the metal plate 1 to thereby form a thin film made of the above metal or alloy. Thereafter, a material such as Cu, Al, Ni or the like is sputtered as an electrode material, thereby forming a thin film serving as an electrode metal layer following the formation of the bonding metal layer. Then, after a photoresist is coated on the resultant substrate, exposure and development processings are conducted to pattern the resist. Using the resist film as a mask, the bonding metal layer and the electrode layer thin film are patterned by a wet etching technique or a dry etching technique which utilizes a plasma surface processing technique. As a result, as shown in FIG. 3B, external electrode pads 2 each consisting of a multilayer of the bonding metal layer and the electrode metal layer are formed.

Figure 3C:
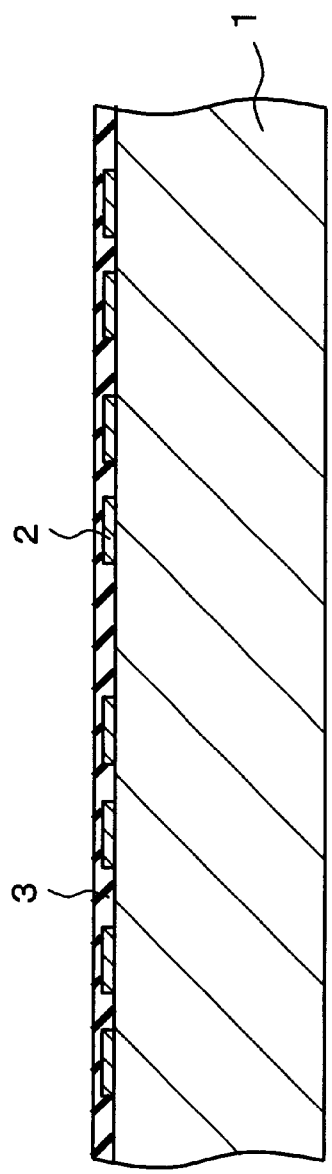

Next, as shown in FIG. 3C, an insulating resin thin film layer 3 is arranged on the sections of the metal plate 1 on which the external electrode pads 2 are formed. This insulating resin thin film layer 3 is formed out of a liquid insulating material by spin coating or by the CVD (Chemical Vapor Deposition) or PVD (Physical Vapor Deposition) method utilizing the plasma surface processing technique.

Next, as shown in FIG. 3D, the insulating resin thin film layer 3 on the external electrode pads 2 is partially removed and openings 4 are formed in the insulating resin thin film layer 3. In this case, after coating a photoresist, exposure and development processing are conducted to thereby form a resist pattern. Then, using this resist as a mask, the insulating resin thin film layer 3 is etched to thereby form the openings 4. To etch the insulating resin thin film layer 3, the wet etching method can be used if the insulating resin thin film layer 3 is made of a material which can be subjected to chemical etching, or the dry etching method utilizing the plasma surface processing technique can be used if the insulating resin thin film layer 3 is made of a material which cannot be subjected to chemical etching.

As shown in FIG. 3E, a metal thin film layer 5 is formed on the entire surface of the insulating resin thin film layer 3. In this case, following the formation of a thin film made of Ti, Cr, Mo or W alloy by sputtering or the like as the bonding metal layer relative to the external electrode pads 2, a thin film made of an electrode material such as Cu, Al or Ni is formed by the sputtering method, the CVD method, the electroless plating method or the like consecutively with the formation of the former thin film, thereby forming the metal thin film layer 5.

Thereafter, as shown in FIG. 3F, a photoresist is coated on the metal thin film layer 5 and exposure and development processings are conducted to thereby form a resist pattern. Using this resist as a mask, the metal thin film layer 5 is etched by either the wet etching method or the dry etching method utilizing the plasma surface processing technique, thereby forming metal thin film wiring sections 6.

In the wiring pattern formation step of the present invention, it is not always necessary to form the metal thin film wiring sections 6 to have a large thickness of about 10 to 30 μm unlike the buildup substrate, and a semiconductor wafer metalization manufacturing method and a manufacturing apparatus therefor can be utilized. Due to this, the thickness of the photoresist and those of the metal thin film wiring sections 6 can be made small, i.e., 1 μm or less. As a result, the metal thin film wiring sections 6 can be easily processed and the fine wiring pattern can be easily provided.

In addition, if the metal thin film wiring section 6 may have a wide pattern pitch, the metal thin film wiring sections 6 may be formed by forming the metal thin film layer 5 on the entire surface of the insulating resin thin film layer 3, coating a photoresist and conducting exposure and development processings to thereby pattern the resist, forming a wiring pattern consisting of the metal thin film while using this resist as a mask, forming a wiring pattern by electroless plating using Cu or the like, separating the photoresist and etching the metal thin film layer 5 while using the wiring pattern as a mask.

Figure 3G:
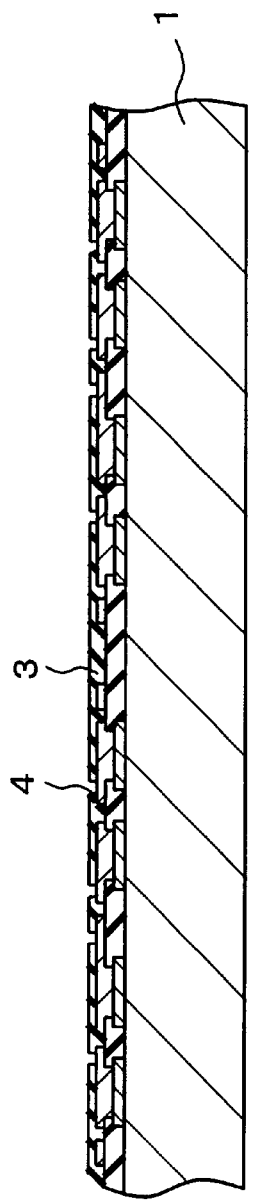
Figure 3H:
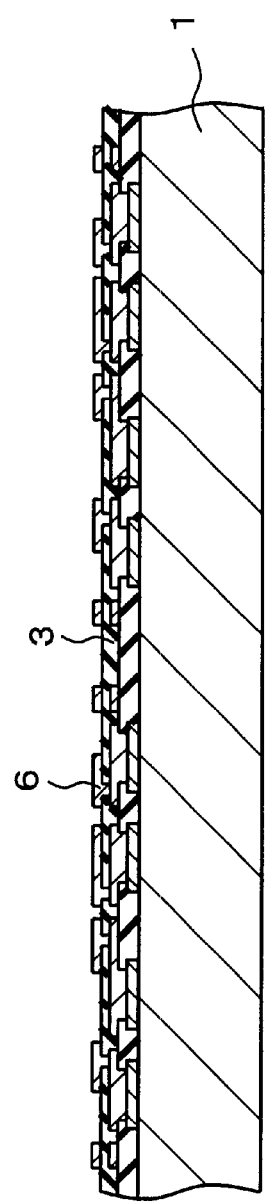
Figure 3I:
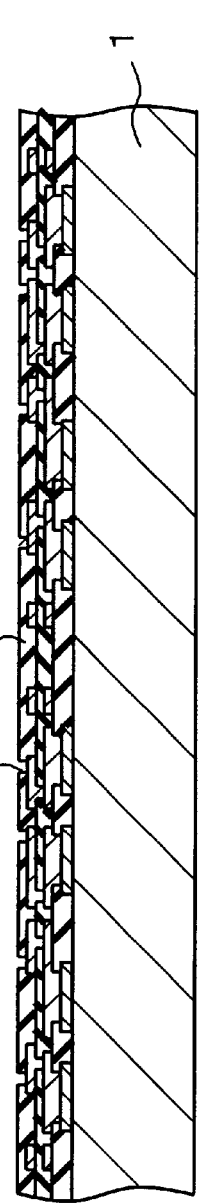

Next, as shown in FIGS. 3G, 3H, 3I, 3J and 3K, by repeating the steps from the formation of the insulating resin thin film layer 3 (FIG. 3C) to the formation of the metal thin film wiring sections 6 in a predetermined pattern, a multilayer wiring structure having a predetermined number of layers is formed. For example, FIGS. 3G, 3I and 3K show that the insulating resin thin film layer 3 and the openings 4 thereof have been formed, and FIGS. 3H and 3J show that the metal thin film wiring sections 6 to be embedded in the respective openings 4 have been formed.

Next, as shown in FIG. 3L, using the technique for forming the metal thin film wiring sections 6, pad electrodes 7 are formed on the uppermost layer of the multilayer wiring structure at positions corresponding to the bump electrode patterns of the flip chip type semiconductor chip, respectively.

Figure 3M:
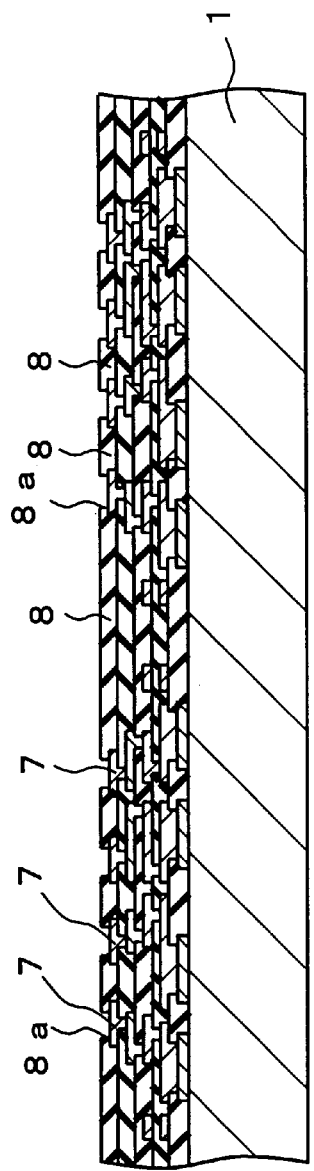

Thereafter, as shown in FIG. 3M, solder resist films 8 are formed to protect the multilayer wiring structure and the pad electrodes 7 and openings 8a are provided in the solder resist films 8 on the pad electrodes 7. If the solder resist films 8 are made of a non-photosensitive material, photoresists are coated on the films 8, respectively and exposure and development processings are conducted. Then, the openings 8a are formed in the solder resist films 8, respectively, by means of either the wet etching method or the dry etching technique utilizing the plasma surface processing technique. If the solder resist films 8 are made of a photosensitive material, exposure and development processings may be directly conducted to the films 8 to form the openings 8a in the respectively solder resist films 8. It is noted that if the insulating resin thin film layer in the multilayer wiring structure has quite high reliability in resisting mechanical and chemical stresses, there is no need to form the solder resist films 8.

Figure 3N:
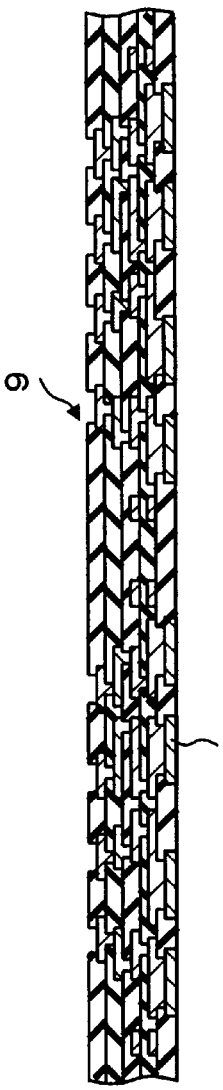

Next, as shown in FIG. 3N, the metal plate 1 having high flatness and existing below the multilayer wiring structure is removed by etching the entire surface of the plate 1 to thereby leave only the multilayer wiring layer 9. In this case, if the metal plate 1 having high flatness is made of Cu, it is possible to easily remove the plate 1 by etching the entire surface of the plate 1 using an etching solution of cupric chloride, ferrous chloride or the like.

Figure 3O:
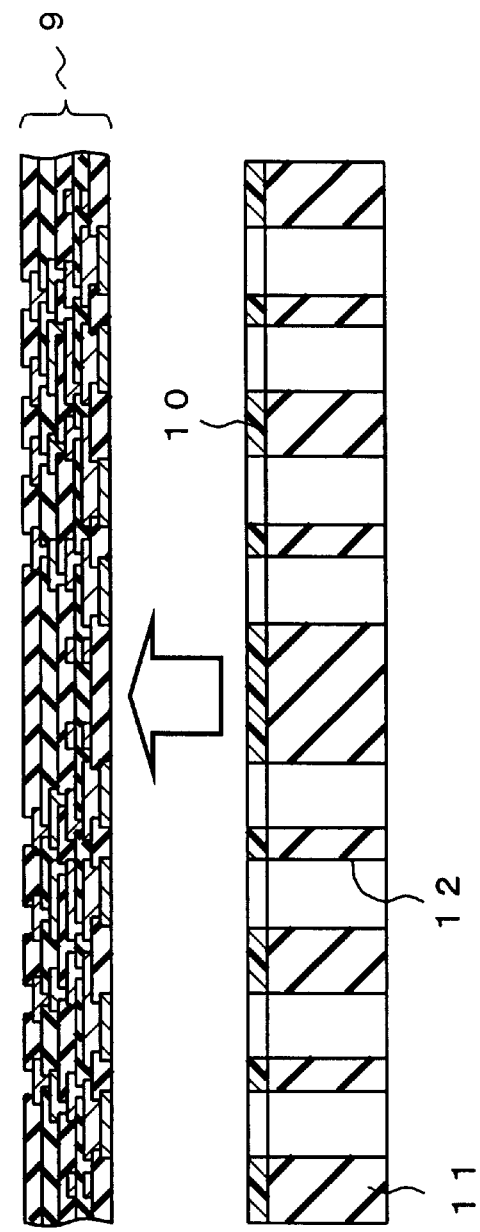

Thereafter, as shown in FIG. 3O, an insulating substrate 11 onto which a bonding agent 10 is attached is prepared and through holes 12 are formed in the insulating substrate 11 at positions at which the external electrode pads 2 existing on the lowermost layer of the multilayer wiring layer 9 are exposed, respectively.

Figure 3P:
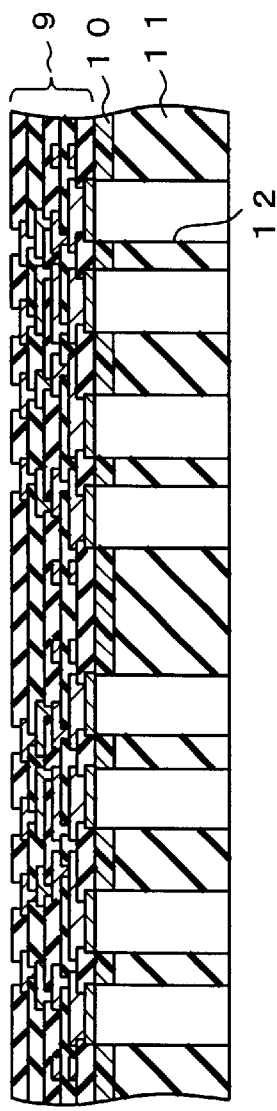

Next, as shown in FIG. 3P, the perforated insulating substrate 11 to which the bonding agent is attached is aligned with the predetermined position of the multilayer wiring layer 9 and bonded to the multilayer wiring layer 9 so as to expose the external electrode pads 2.

Figure 3Q:
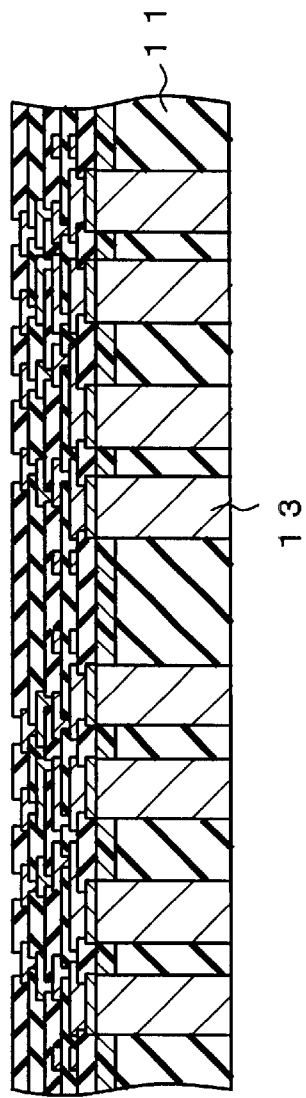

As shown in FIG. 3Q, a conductive bonding agent 13 is filled in the through holes 12 provided in the adhesive agent attached-insulating substrate 11 bonded to the multilayer wiring layer 9, whereby a multilayer wiring substrate is completed.

In the above case, to shorten the steps, the substrate having the through holes 12 provided in the adhesive agent attached-insulating substrate 11 and filled with the conductive material may be bonded to the multilayer wiring layer 9 in advance.

If an electrical characteristic test is conducted only to the single multilayer wiring substrate after the completion of the above-stated steps, good flip chip type semiconductor chips may be mounted only to the sections determined to be electrically good in a later flip chip mounting step.

Figure 3R:
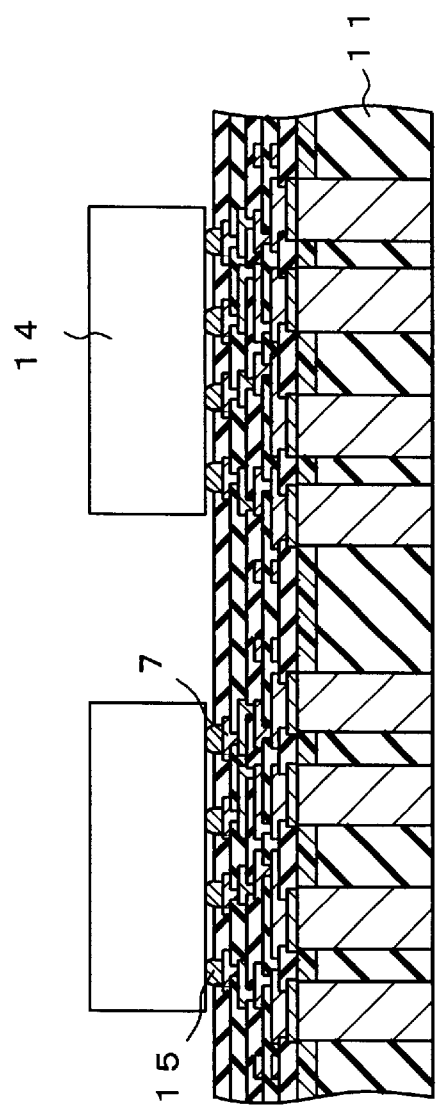

Next. As shown in FIG. 3R, flip chip type semiconductor chips 14 are mounted on the pad electrodes 7, respectively while the surface of the chips on which surface the bump electrodes 15 are provided are directed downward, and a flip chip mounting processing is conducted. In this case, if the bump electrode 15 for each flip chip type semiconductor chip 14 is a solder mainly consisting of a metal material such as Sn, Pb or the like, the flip chip mounting can be conducted by heating reflow step using flux. Further, if the bump electrode 15 for each flip chip type semiconductor chip 14 is a solder mainly consisting of a metal material such as Au, In or the like, the flip chip mounting can be conducted by thermal pressing.

Figure 3S:
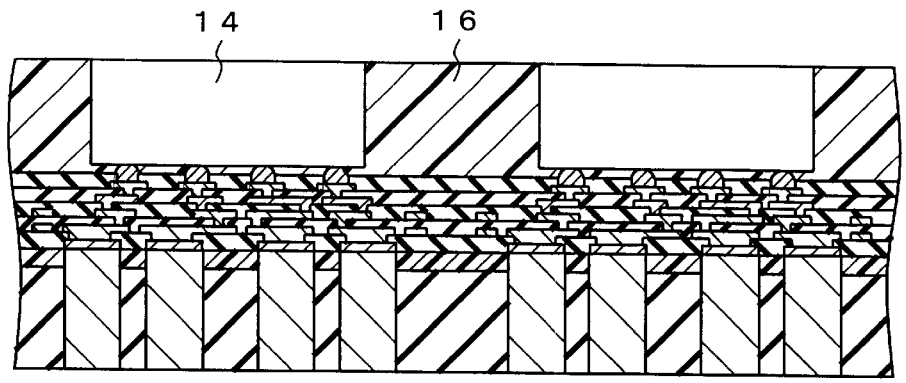

Thereafter, as shown in FIG. 3S, an insulating resin layer 16 is filled in the side surfaces of the flip chip semiconductor chips 14, flip chip junctions and regions in which the multilayer wiring layer 9 is exposed so as to protect the flip chip semiconductor chips 14, the flip chip junctions and the multilayer wiring layer 9.

In this case, to provide the insulating resin layer 16, an injection resin introduction technique or a transfer sealing technique including a vacuum sealing technique can be employed.

Figure 3T:
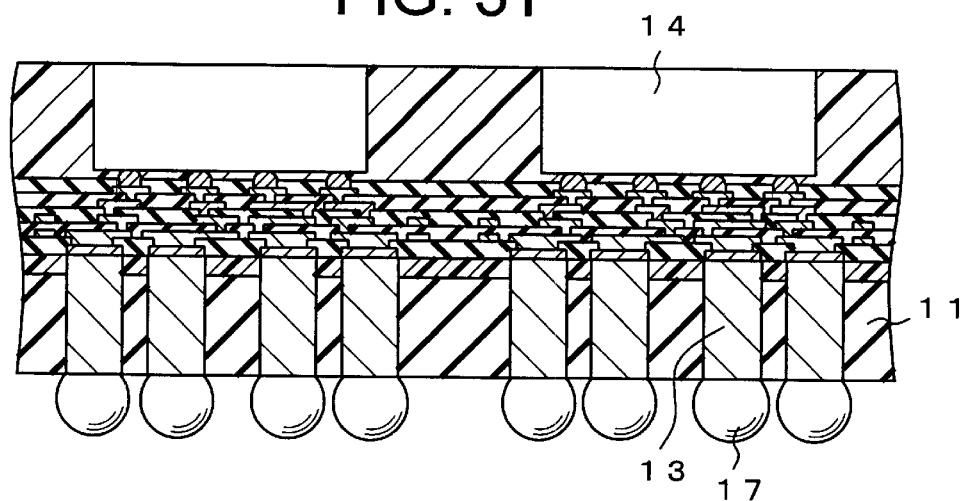
Figure 3U:
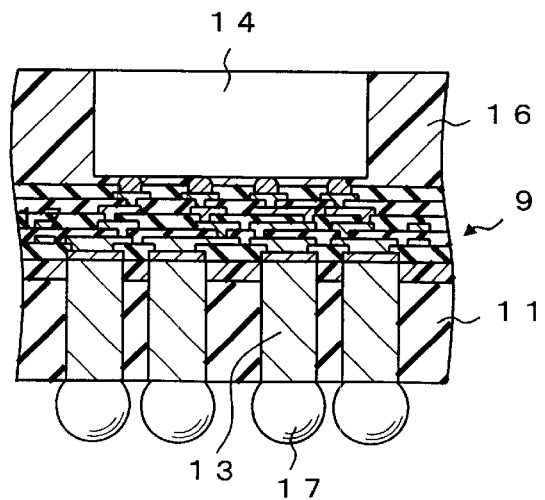

Then, as shown in FIG. 3T, solder balls 17 each mainly consisting of a metal material such as Sn or Pb are attached, as external terminals, onto the conductive bonding agent 13 filled in the through holes 12 provided in the bonding agent-attached insulating substrate 11. In this case, after selectively applying flux onto the conductive bonding agent 13 filled in the through holes 12, the solder balls 17 are put on the bonding agent 13 and a heat processing is conducted by an IR reflow step, thereby mounting the solder balls 17.

Thereafter, as shown in FIG. 3U, the resultant substrate is cut into a plurality of pieces by a cut and separation technique using a dicing blade or the like, thereby completing flip chip type semiconductor devices.

With the multilayer wiring substrate manufacturing method according to the present invention, it is possible to maintain high flatness and to suppress the occurrence of an internal stress to the multilayer wiring layer 9. Namely, according to the present invention, since the multilayer wiring structure (multilayer wiring layer 9) is formed on the metal plate 1 having high flatness, the multilayer wiring layer 9 has also high flatness, less warps and a low internal stress. Therefore, if the semiconductor chips 14 are mounted after bonding the insulating substrate 11 to this multilayer wiring layer 9, it is possible to manufacture semiconductor devices with high yield.

Further, according to the semiconductor device of the present invention, the solder balls 17 are provided so that an end user mounts the semiconductor device of the present invention on the substrate of the end user. Since the through holes 12 provided in the insulating substrate 11 are filled with the conductive bonding agent 13 and the solder balls 17 are bonded onto the conductive bonding agent sections 13, respectively, the conductive bonding agent sections 13 function as external electrode column sections and allow increasing the standoff heights of the solder balls 17. Further, if the resin substrate is used as the insulating substrate 11, the stress buffer effect of the insulating resin is also added, a flip chip type semiconductor device having excellent mounting reliability can be obtained. Moreover, such a material as to have a similar linear expansion coefficient to that of the mounting substrate prepared by the end user can be easily used for the insulating substrate 11. A material for this insulating substrate 11 depends on a material for the mounting substrate used by the end user. For example, polyimide, glass epoxy, alumina, mullite or the like may be employed as a material for the insulating substrate 11. Since a material for the insulating substrate 11 can be selected from a wide range of materials, it is possible to prevent mismatch in the linear expansion coefficient after the end user mounts the flip chip type semiconductor device on the mounting substrate and to particularly enhance temperature cycle characteristic among mounting reliability factors.

As can be understood from the above, according to the flip chip type semiconductor device of the present invention, it is possible to easily enhance a standoff height during mounting and to minimize mismatch in the linear expansion coefficient. Thus, a flip chip type semiconductor device excellent in mounting reliability can be easily manufactured. Further, according to the flip chip type semiconductor device of the present invention, the standoff height of each solder ball is large and a stress can be absorbed by the solder balls. Due to this, unlike the conventional device, it is not necessary to absorb a stress by providing a thick wiring.

Moreover, in the step of forming the wiring pattern of the multilayer wiring substrate of the present invention, it is not always necessary to form the metal thin film wirings thick or about 10 to 30 μm unlike the buildup substrate according to the conventional technique and a semiconductor wafer metalization manufacturing method and a manufacturing apparatus therefor can be utilized. Due to this, the thickness of each photoresist and that of the metal thin film wiring section can be processed in a region as thin as 1 μm or less and the wiring pattern can be, therefore, easily made smaller in size. Besides, by promoting a finer wiring pattern, it is possible to increase the density of an organic multilayer wiring substrate and to decrease the outer dimension of a single multilayer wiring substrate, thereby greatly reducing manufacturing cost.

Furthermore, with the structure proposed by Japanese Patent Application No. 11-284566, in the step of selectively etching away the first substrate having flatness and high rigidity (Base substrate having high flatness) to thereby form external electrode column sections, the problem that the etching-away step for forming the external electrode column sections is difficult to execute, arises particularly if the thickness of the first substrate (Base substrate) is quite large or 1.0 mm or more. According to the present invention, by contrast, since the entire surface of the Base substrate having high flatness is removed, it is not required to selectively etch away the Base substrate unlike Japanese Patent Application No. 11-284566, thereby quite facilitating manufacturing process.

Additionally, according to the present invention, it is possible to manufacture respective packages by the wafer level processing. Thus, compared with a packaging method for manufacturing respective packages from single pieces, it is possible to greatly reduce the number of steps and to thereby greatly reduce cost.

As for the flip chip type semiconductor device manufacturing method, it is preferable that the insulating resin used for the insulating resin thin film layer 3 mainly consists of one of an epoxy resin, a silicon resin, a polyimide resin, a polyolefin resin, a cyanate ester resin, a phenol resin and naphthalene resin.

Figure 4:
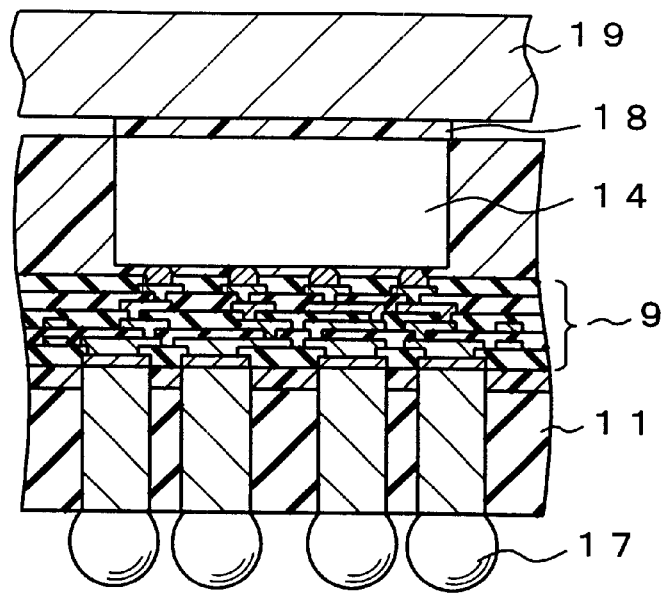
FIG. 4 is a cross-sectional view of a flip chip type semiconductor device manufactured by the second embodiment according to the present invention.

Next, the second embodiment of the present invention will be described hereinafter with reference to FIG. 4. A flip chip type semiconductor chip is often applied to a multiple-pin, high-speed logic device. In this respect, it matters how to efficiently radiate the heat of the semiconductor chip. The second embodiment enhances the thermal characteristic of the flip chip type semiconductor device according to the present invention.

A flip chip type semiconductor device manufacturing method in the second embodiment is exactly the same as that in the first embodiment until the step shown in FIG. 3U. In the second embodiment, a step shown in FIG. 4 is further added. Namely, using a radiating bonding agent 18, a heat spreader 19 is attached to the reverse surface of the flip chip type semiconductor chip 14. By providing this heat spreader 19, the radiation effect of the semiconductor chips 14 can be obtained.

The radiating heat spreader 19 mainly consisting of a metal material such as Cu, Al, W, Mo, Fe, Ni, Cr or the like can be formed. The heat spreader 19 can be also formed out of a ceramic material such as alumina, AlN, SiC, mullite or the like.

The radiating bonding agent 18 mainly consists of one of an epoxy resin, a silicon resin, a polyimide resin, a polyolefin resin, a cyanate ester resin, a phenol resin and a naphthalene resin. The bonding agent 18 contains a ceramic material such as Ag, Pd, Cu, Al, Au, Mo, W, diamond, alumina, AlN, mullite, BN, SiC or the like in addition to the main component.

Figure 5:
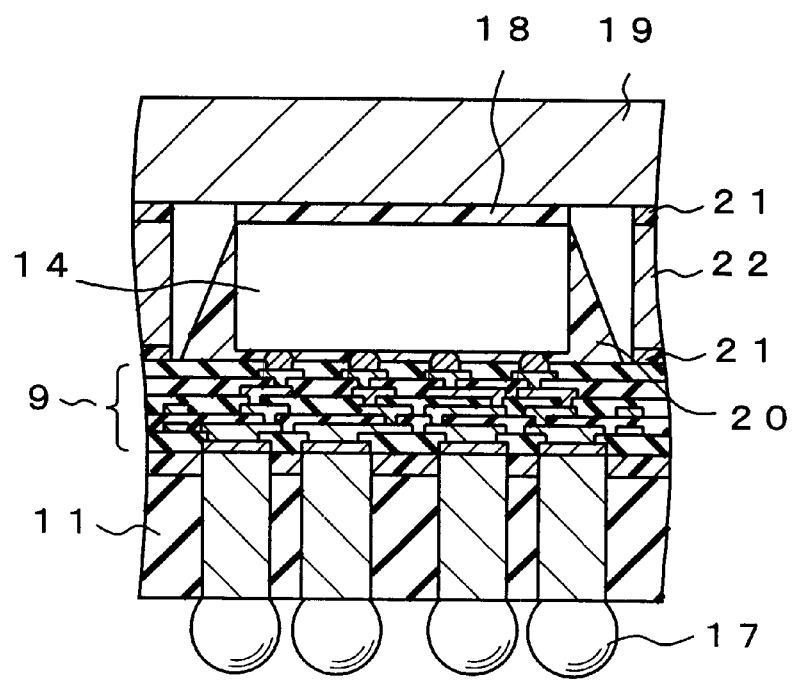
FIG. 5 is a cross-sectional view of a flip chip type semiconductor device manufactured by the third embodiment according to the present invention.

Next, the third embodiment of the present invention will be described hereinafter with reference to FIG. 5. In the third embodiment, an under-fill resin 20 is provided between the flip chip type semiconductor chip 14 and the multilayer wiring substrate. Then, using a bonding agent 21, a stiffener 22 made of metal or ceramic is attached so as to secure the flatness of the multilayer wiring substrate. Thereafter, using a radiating bonding agent 18, a radiating heat spreader 19 is attached to the reverse surface of the flip chip type semiconductor chip 14.

In the flip chip type semiconductor device in the third embodiment constituted as stated above, the under-fill resin 20 which is mainly utilized in the conventional flip chip type semiconductor device manufacturing technique is employed without utilizing a method of arranging the insulating resin layer 16 by means of the injection method or the transfer sealing method utilized in the first and second embodiments. It is, therefore, possible to manufacture a flip chip type semiconductor device having the multilayer wiring substrate of the present invention without the need to employ a special manufacturing apparatus.

Furthermore, the under-fill resin 20 may be constituted to mainly consist of one of an epoxy resin, a silicon resin, a polyimide resin, a polyolefin resin, a cyanate ester resin, a phenol resin and naphthalene resin.

Next, the fourth embodiment will be described with reference to FIGS. 6A to 6H. The fourth embodiment intended to obtain a patterned, two-sided wiring substrate 31 is employed instead of the insulating substrate 11 employed in the first embodiment, whereby a flip chip type semiconductor device capable of further realizing high performance and cost reduction.

Normally, the multilayer wiring layer 9 employed in the first embodiment on which the logic flip chip type semiconductor chips are mounted, has a strip line conductor channel constitution for putting an Sig layer between GND plane layers such as, for example, a GND plane layer/an Sig layer/a GND plane layer/a power supply plane layer/a GND plane layer. This makes it possible to enhance electrical characteristic including controlling the impedance of an Sig wiring, reducing inductance and reducing cross talk noise.

Meanwhile, it is essential to form stable power supply wiring layers, i.e., a power supply plane layer and a GND plane layer so as to stabilize respective circuit operations and many layers are normally added below the Sig layer. However, if the number of layers is repeatedly increased by the buildup method as described in the first embodiment, it causes the increase of the number of steps and the deterioration of manufacturing yield. Consequently, cost is disadvantageously pushed up.

Considering the above, the fourth embodiment of the present invention is intended to solve the disadvantages of the first embodiment. The flip chip type semiconductor device in the fourth embodiment is constituted such that after the formation of a minimum multilayer wiring layer 9, a two-sided wiring substrate 31 on both surfaces of which have been patterned and which is provided with a power supply plane function and a GND plane function is bonded to the multilayer wiring layer 9.

In other words, since the power supply plane function and the GND plane function are added to the two-sided wiring substrate 31, the multilayer wiring layer 9 formed on a metal plate 1 having excellent flatness can be constituted by reduced-number of layers such as, for example, a GND plane layer/an Sig layer/a GND plane layer. As a result, it is possible to easily reduce the number of steps, to easily enhance manufacturing yield and to thereby reduce overall cost.

Hereinafter, the fourth embodiment of the present invention will be described concretely. A flip chip type semiconductor device manufacturing method in the fourth embodiment is exactly the same as that in the first embodiment until a step shown in FIG. 6A. It is noted that the following description is intended to give an example of steps and does not limit the scope of the present invention in respect of structure, constitution, material and the like.

First, as shown in FIG. 6A, the entire surface of a metal plate 1 having high flatness and existing below a multilayer wiring layer is etched away to thereby leave only the multilayer wiring layer 9. In this case, if the metal plate 1 having high flatness is made of, for example, Cu, the entire surface of the metal plate 1 can be easily etched away by using an etching solution of cupric chloride, ferrous chloride or the like.

Next, as shown in FIG. 6B, a bonding layer 32 and a perforated two-sided wiring substrate 31 so as to expose external electrode pads 2 existing on the lowermost layer of the multilayer wiring structure are prepared.

FIG. 7A is a cross-sectional view of the enlarged two-sided wiring substrate 31 and FIG. 7B is a plane view thereof seen from a power supply plane 29. A conductor pattern layer 24 made of a metal material such as Cu is formed on each surface of the insulating resin core substrate 23 of the two-sided wiring substrate 31. Through hole processed sections 25 are formed in the insulating resin core substrate 23 at positions corresponding to external electrode pads 2, respectively. The side surfaces of the through hole processed sections 25 are subjected to a through hole plating processing by a metal material such as Cu. Also, signal (Sig) terminals 26, power supply terminals 27, GND terminals 28 and a power supply plane 29 are formed on the front surface of the insulating resin core substrate 23 by the conductor pattern layer 24. Likewise, Sig terminals 26, power supply terminals 27, GND terminals 28 and a GND plane 30 are formed on the reverse surface of the substrate 23 by the conductor pattern layer 24. Namely, the front surface of the insulating resin core substrate 23 is mainly covered with the power supply plane 29, and the Sig terminals 26 and the GND terminals 28 are electrically disconnected from the power supply plane 28 by ring-shaped grooves. Likewise, the reverse surface of the insulating resin core substrate 23 is mainly covered with the GND plane 30, and the Sig terminals 26 and the power supply terminals 27 are electrically disconnected from the GND plane 30 by ring-shaped grooves. The Sig terminals 26, the power supply terminals 27, the GND terminals 28 at the front surface side of the substrate 23 and the Sig terminals 26, the power supply terminals 27 and the GND terminals 28 at the reverse surface side thereof are mutually connected by a Cu film or the like formed on the inner surface of each through hole by the through hole plating processing.

The both surfaces of the two-sided wiring substrate 31 constituted as stated above is designed in a predetermined pattern so that the Sig terminals 26, the power supply terminals 27 and the GND terminals 28 are formed so as to correspond to the pin functions of the external electrode pads 2 of the multilayer wiring layer 9, that the upper conductor pattern layer 24 on the upper surface of the two-sided wiring substrate 31 functions as the power supply plane 29 and that the lower conductor pattern layer 24 of the two-sided wiring substrate 31 functions as the GND plane 30.

In addition, the two-sided wiring substrate 31 constituted as stated above can be easily manufactured at low cost if a two-sided Cu foil bonded substrate employing a glass epoxy material used for an ordinary circuit substrate. While the two-sided wiring substrate 31 shown in FIGS. 7A and 7B consists of two layers, the two-sided wiring substrate should not be limited thereto and may have a multilayer structure having four layers or six layers.

Thereafter, as shown in FIG. 6C, the two-sided wiring substrate 31 is aligned with the predetermined position of the multilayer wiring layer 9 so as to expose the external electrode pads 2. A perforated, sheet-like bonding layer 32 is interposed between the two-sided wiring substrate 31 and the multilayer wiring layer 9 and the two-sided wiring substrate 31 is bonded to the multilayer wiring layer 9 by this bonding layer 32.

In this case, if a vacuum lamination unit or a vacuum presser employed in an ordinary circuit substrate manufacturing process is employed, the processing for bonding the two-sided wiring substrate 31 to the multilayer wiring layer 9 as stated above can be easily carried out.

Further, if a material having a similar linear expansion coefficient as that of the mounting substrate used by an end user can be easily employed for the two-sided wiring substrate 31. By doing so, it is possible to easily solve the disadvantage in that the temperature cycle characteristic is particularly inferior among the mounting reliability factors due to mismatch in the linear expansion coefficient after the end user mounts the flip chip type semiconductor device onto the mounting substrate.

Figure 6D:
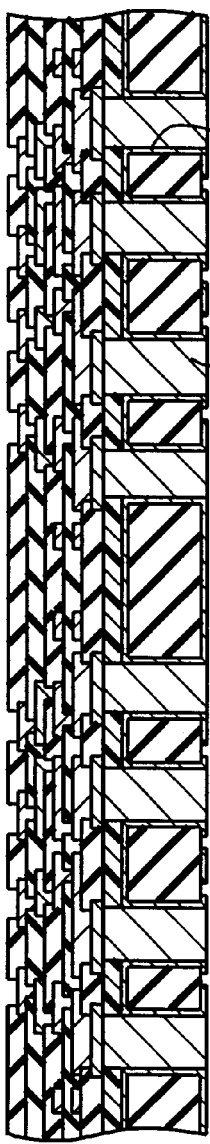

Next, as shown in FIG. 6D, the through hole processed sections 25 provided in the two-sided wiring substrate 31 bonded to the multilayer wiring layer 9 are filled with a conductive bonding agent 13. A material for the conductive bonding agent 13 may be a solder paste containing solder powder flux or a mixture of metal powder, such as Cu, Ni or the like, having excellent wettability and an organic insulating bonding agent. Further, the conductive bonding agent 13 can be provided and filled in the through hole processed sections 25 by screen printing or the like.

In this case, with a view to shortening steps, after filling the through hole processed sections 25 provided in the two-sided wiring substrate 31 with the conductive material, the substrate 31 may be bonded to the multilayer wiring layer 9.

Furthermore, if an electrical characteristic test is executed to a single multilayer wiring substrate after the completion of the overall steps, it suffices to mount good flip chip type semiconductor chips only to the sections which have been determined to be electrically good in a later flip chip mounting step.

Figure 6E:
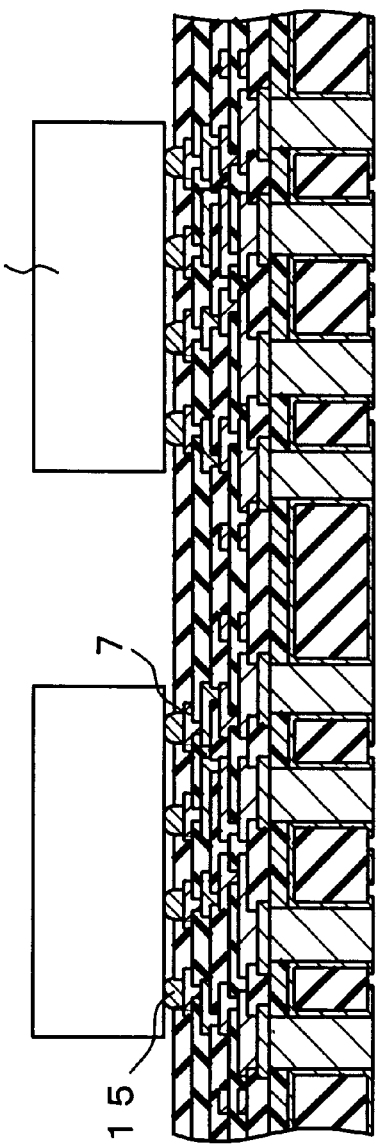

Next, as shown in FIG. 6E, flip chip type semiconductor chips 14 are mounted on the pad electrodes 7 formed on the uppermost layer of the multilayer wiring layer 9 while the surfaces of the semiconductor chips 14 on which surfaces the bump electrodes 15 are provided, are directed downward. In this case, if each bump electrode 15 of the flip chip type semiconductor chips 14 is formed out of a solder mainly consisting of a metal material such as Sn, Pb or the like, the flip chip semiconductor chips 14 can be mounted on the pad electrodes 7 by a thermal reflow step employing flux. If the bump electrode 15 mainly consists of a metal material such as Au, In or the like, the flip chip semiconductor chips 14 can be mounted on the pad electrodes 7 by thermal pressing.

Figure 6F:
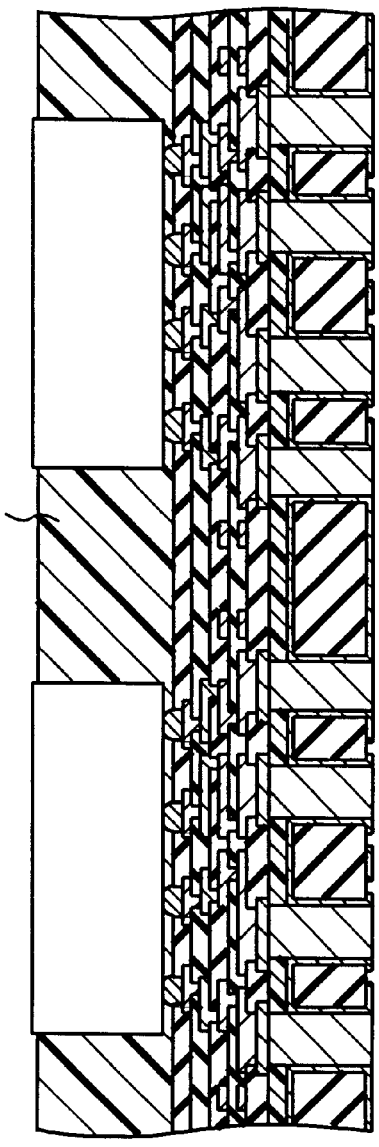

Thereafter, as shown in FIG. 6F, an insulating resin layer 16 is provided on the side surfaces of the flip chip semiconductor chips 14, flip chip junctions and regions in which the multilayer wiring layer 9 is exposed so as to protect the flip chip semiconductor chips 14, the flip chip junctions and the multilayer wiring layer 9.

In this case, to provide the insulating resin layer 16, an injection resin introduction technique or a transfer sealing technique incorporating a vacuum sealing technique may be employed.

Figure 6G:
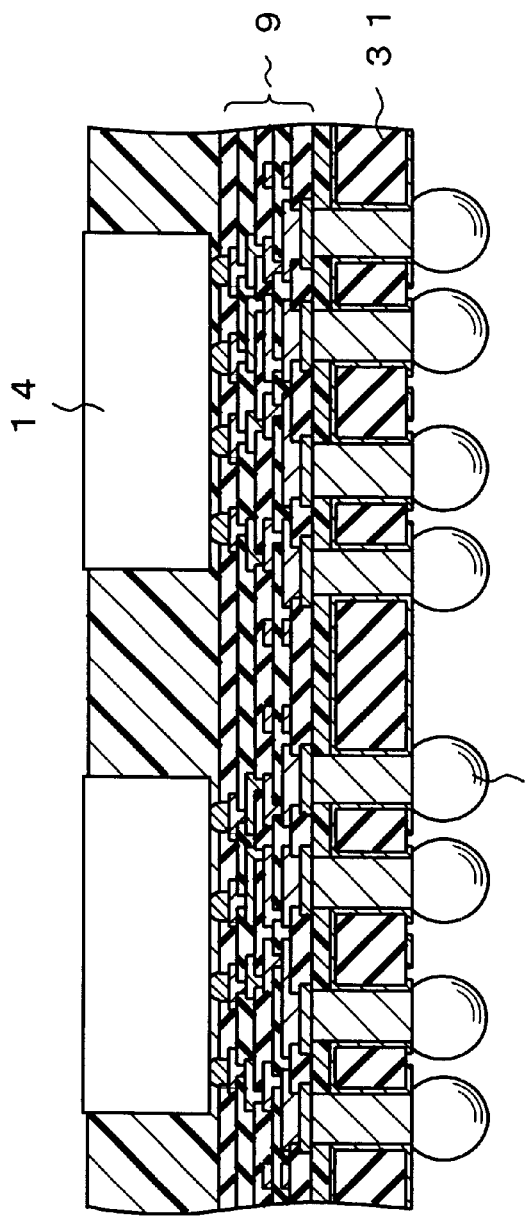

Then, as shown in FIG. 6G, solder balls 17 mainly consisting of Sn, Pb or the like are formed, as external terminals, on the conductive bonding agent 13 filled in the through hole processed sections 25 provided in the two-sided wiring substrate 31. In this case, after selectively applying flux onto the conductive bonding agent 13 filled in the through hole processed sections 25, the solder balls 17 are put on the agent 13 and a heat processing is performed by an IR reflow step, whereby the solder balls 17 can be mounted on the conductive bonding agent 13.

It is also possible to use a two-sided wiring substrate 31 having such a design specification (spiral Via structure) as to displace the surfaces on which the solder balls 17 are mounted from the through hole processed sections 25 provided in the two-sided wiring substrate 31 and to form solder ball mounting land sections on the GND planes 30 within the conductor pattern layer 24.

Figure 6H:
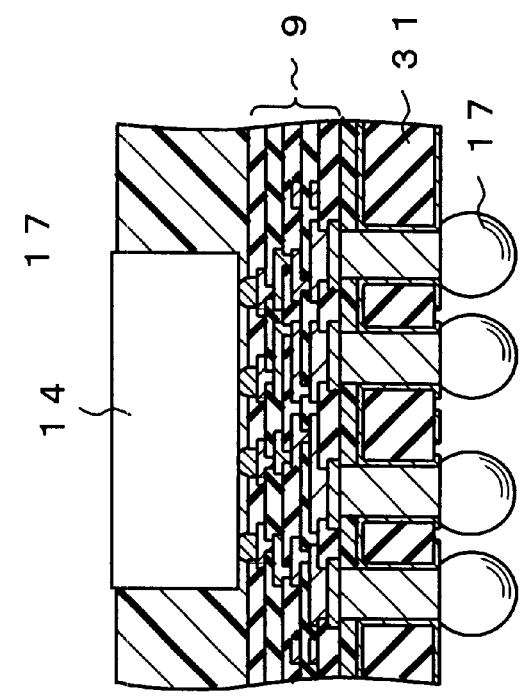

Thereafter, as shown in FIG. 6H, the resultant substrate is cut into a plurality of pieces by a cut and separation technique employing a dicing blade or the like, whereby flip chip type semiconductor device is manufactured.

With the above-stated constitution, the patterned two-sided wiring substrate 31 is employed instead of the insulating substrate 11 employed in the first embodiment. This embodiment, therefore, ensures an enhanced power supply plane function and an enhanced GND plane function compared with the first embodiment. Accordingly, it is possible to further ensure high performance, to advantageously reduce the number of layers as constituent elements of the multilayer wiring layer and to thereby reduce cost.

What is claimed is:

1. A flip chip type semiconductor device manufacturing method, comprising the steps of:
    forming a multilayer wiring structure on a first substrate consisting of a flat metal plate;
    etching away said first substrate to form a second substrate consisting of a multilayer wiring layer;
    coupling a third substrate to the second substrate consisting of said multilayer wiring layer to obtain a multilayer wiring substrate; and
    mounting a semiconductor chip on said second substrate.

2. A flip chip type semiconductor device manufacturing method according to claim 1, wherein
    said third substrate is one of an insulating substrate and a multilayer substrate, and provided with holes.

3. A flip chip type semiconductor device manufacturing method according to claim 1, wherein
    said second substrate is formed by the steps of:
        forming an external electrode pad on said first substrate;
        forming an insulating thin film layer on an entire surface of said external electrode pad, and etching away said insulating thin film on said external electrode pad to form an opening;
        forming a metal thin layer on an entire surface, and patterning said metal thin layer to form a metal thin film wiring section connected to said external electrode pad in said opening;
        repeating formation of the insulating thin film layer and formation of the metal thin film wiring section; and
        forming an insulating resin thin film layer on an entire surface, forming an opening on the metal thin film wiring section below the insulating resin thin film layer and forming a pad electrode in the opening.

4. A flip chip type semiconductor device manufacturing method according to claim 3, comprising the step of:
    embedding a conductive bonding agent into the hole of said third substrate.

5. A flip chip type semiconductor device manufacturing method according to claim 4, comprising the step of:
    coupling a solder ball onto said conductive bonding agent.

6. A flip chip type semiconductor device manufacturing method according to claim 5, wherein
    said semiconductor chip has a bump electrode; and
    in a step of mounting said semiconductor chip, said bump electrode is coupled to the external electrode pad of said second substrate.

7. A flip chip type semiconductor device manufacturing method according to claim 1, comprising the step of:
    coupling a radiator to a rear surface of said semiconductor chip through a heat transfer bonding agent.

8. A flip chip type semiconductor device manufacturing method according to claim 7, comprising the steps of:
    coupling stiffeners on said second substrate at positions sandwiching said semiconductor chip; and
    mounting said radiator on said semiconductor chip and said stiffener.

* * * * *